(12) United States Patent  
Umemoto et al.

(10) Patent No.: US 6,876,685 B2  
(45) Date of Patent: Apr. 5, 2005

(54) SEMICONDUCTOR LASER DEVICE

(75) Inventors: Hitoshi Umemoto, Naka-gun (JP); Hiroaki Matsumura, Tokushima (JP); Masanao Ochiai, Anan (JP)

(73) Assignee: Nichia Corporation, Anan (JP)

( * ) Notice: Subject to any disclaimer, the term of this patent is extended or adjusted under 35 U.S.C. 154(b) by 101 days.

(21) Appl. No.: 10/457,823

(22) Filed: Jun. 10, 2003

(65) Prior Publication Data

US 2003/0231679 A1 Dec. 18, 2003

(30) Foreign Application Priority Data

Jun. 10, 2002 (JP) ........................................ 2002-169242  
May 13, 2003 (JP) ........................................ 2003-135097

(51) Int. Cl.[7] .............................. H01S 3/04; H01S 5/00  
(52) U.S. Cl. ........................................... 372/43; 372/36  
(58) Field of Search ............................. 372/29.021, 31, 372/36, 43; 257/724, 100

(56) References Cited

U.S. PATENT DOCUMENTS

| 5,262,675 | A | * | 11/1993 | Bausman, Jr. ............... 257/714 |
| 5,309,460 | A | * | 5/1994 | Fujimaki et al. .............. 372/36 |
| 5,557,116 | A | * | 9/1996 | Masui et al. ................. 257/100 |
| 5,581,523 | A | | 12/1996 | Seki et al. ................. 399/44.11 |
| 5,600,621 | A | | 2/1997 | Noda et al. .................. 369/116 |
| 5,680,384 | A | | 10/1997 | Seki et al. ................... 369/112 |
| 5,761,229 | A | * | 6/1998 | Baldwin et al. ............... 372/31 |
| 5,771,254 | A | * | 6/1998 | Baldwin et al. ............... 372/31 |
| 5,801,402 | A | | 9/1998 | Shin ............................ 251/80 |
| 5,809,050 | A | * | 9/1998 | Baldwin et al. ............... 372/43 |
| 5,835,514 | A | * | 11/1998 | Yuen et al. .................... 372/36 |
| 5,878,069 | A | | 3/1999 | Kamibayashi et al. ......... 372/36 |
| 6,031,856 | A | * | 2/2000 | Wu et al. ...................... 372/43 |
| 6,188,132 | B1 | * | 2/2001 | Shih et al. .................. 257/724 |
| 6,567,435 | B1 | * | 5/2003 | Scott et al. ............. 372/29.021 |
| 6,646,975 | B1 | * | 11/2003 | Uchizaki et al. ............ 369/121 |

FOREIGN PATENT DOCUMENTS

| JP | 59-208886 A | 11/1984 |
| JP | 60-39880 A | 3/1985 |
| JP | 63-317931 A | 12/1988 |
| JP | 03-189935 A | 8/1991 |
| JP | 05-334711 A | 12/1993 |
| JP | 06-309685 A | 11/1994 |
| JP | 08-286016 A | 11/1996 |
| JP | 08-321657 A | 12/1996 |
| JP | 09-198707 A | 7/1997 |
| JP | 09-283852 A | 10/1997 |

* cited by examiner

Primary Examiner—Don Wong  
Assistant Examiner—Hung Tran Vy  
(74) Attorney, Agent, or Firm—Smith Patent Office

(57) ABSTRACT

A laser device having at least a semiconductor laser element, a window allowing light emitted from the emission end face of the semiconductor laser element to pass therethrough, a photodetector detecting a portion of emitted light reflected from the window that is not being transmitted, and a stem whereon the semiconductor laser element and the photodetector are installed. The window is disposed vertically above the semiconductor laser element. The photodetector is placed at an angle with respect to a horizontal plane and is located contiguous with the main surface of the stem. The laser device is capable of maintaining a stable APC drive regardless of the deterioration of the semiconductor laser element that may occur from continuous oscillation for a long time.

13 Claims, 16 Drawing Sheets

LD( λ :408nm)

FFP-Y

FFP-Y

SEMICONDUCTOR LASER DEVICE

BACKGROUND OF THE INVENTION

1. Field of the Invention

The present invention relates to a semiconductor laser device, used as a light source for an optical disc, such as DVD or the like. More particularly the present invention relates to a semiconductor laser device having a photodetector for detecting light.

2. Discussion of the Related Art

In a semiconductor laser device as shown in FIG. 11, fluctuation of light is detected by installing a photodiode 2 in the device which receives a laser beam emitted from the monitor side of the end face of the light guide of a semiconductor laser element 1 and activates an APC (Automatic Power Control), thereby maintaining a constant output power of light.

For example, Japanese Unexamined Patent Publication No. S59-208886 discloses a structure of a light emitting semiconductor device, wherein a laser beam from a semiconductor laser chip is emitted from the resonator end faces formed on the top and bottom of the chip, and a light receiving element is fixed on a stem with an angle for monitoring the laser beam emitted from the mirror face at the bottom of the chip, whereby preventing light reflected on the surface of the light receiving element from going out of the device through the transparent window of the cap.

In addition, Japanese Unexamined Patent Publication No. S63-317931 discloses an optical head having a beam splitter 10 as shown in FIG. 12, which splits a laser beam into a reflecting laser beam and a transmitting laser beam, installed at a predetermined angle to the optical axis of the laser beam.

Also, Japanese Unexamined Patent Publication No. S60-39880 discloses a light emitting device as shown in FIG. 13, which includes a laser chip emitting laser beams from its both end faces; a portion of the laser beams is transmitted through a transparent window and emitted out from a package consisting of a stem and a cap, another part of the laser beam is emitted toward a photodetector mounted on the main surface of the stem; a photodetector 2 is placed on the stem at an angle, and an antireflection film 11 comprising black paint or the like is coated on the inner wall of the cap 6 and the main surface of the stem 4, respectively, so as to prevent light reflected from the surface of the photodetector from being emitted out of the transparent window.

SUMMARY OF THE INVENTION

However, because the semiconductor laser device described in the above mentioned Japanese Unexamined Patent Publication Nos. S59-208886 and S60-39880 has a structure uses a light radiated from the monitor side of the semiconductor laser element for optical detection by the photodetector, an accurate and stable power confirmation can not be attained without constant emission from both the emission side and the monitor side of the semiconductor laser element. Up to now, continuous emission of a semiconductor laser element causes deterioration of the emission end face of the semiconductor laser element, which results in sensitive fluctuation in the beam output ratio described above. Consequently, there have been cases where a stable APC drive cannot be obtained. In addition, such a structure employing an emitted beam from the monitor side for optical detecting in a photodetector is generally designed so as to reduce the reflectivity at the end face of the monitor side of the laser element and to radiate light from the end face of the emitting side. An AR film (antireflection film) is applied to the both sides of the window for efficient emission of laser light from the light emitting face to outside of the device.

In addition, such a semiconductor laser device described in the above Japanese Unexamined Patent Publication No. S63-317931 has a beam splitter as a window for emitting laser beams outside of the device which is placed at an angle to the optical axis of the laser beam, and has the photodetector attached to the mounting base for receiving the reflected light from the beam splitter effectively. However, because the beam splitter is set so as to be inclined relative to the optical axis of the laser light, a cap with a complicated shape is required. Also, the shape of the transmitting beam may be changed depending on the incident angle when the laser beams enter the beam splitter. Where radiated laser beams from the end face of the laser element are of an elliptical shape, there has been a problem for process yield, and astigmatism has been increased. In addition, reflected light from the photodetector can be emitted outside from the beam splitter.

In addition, in the above-cited Japanese Unexamined Patent Publication No. S63-317931, a photodetector is attached to a mount base first and mounted on the stem, resulting in a complicated process and an inefficient mounting assembly. In the method such as described in the above-cited Japanese Unexamined Patent Publication No. S60-39880, an antireflection film is applied to inner surface of the cap, thereby increasing the manufacturing processes and costs.

Consequently, it is an object of the present invention to provide a solution for the above-described problems of the art, and therefore, is aimed at providing a semiconductor laser device with a stable APC driving. Furthermore, it is also an object of the present invention to provide a semiconductor laser device having a FFP (far-field pattern) of a Gaussian shape.

In addition, it is also an object to provide a simple and versatile device.

An aspect of the present invention is directed to a semiconductor laser device comprising: a semiconductor laser element; a window allowing light rays emitted from the semiconductor laser element to transmit there through; a photodetector for detecting a portion of the emitted light that is reflected by the window, wherein the photodetector is placed at an angle with respect to a horizontal plane of the device.

In addition the semiconductor laser device according to the present invention is designed so that the photodetector is angled with respect to the horizontal plane of the device according to the following equation:

$$lg < lga = \left\{ lpg + \frac{((la/2) \times (lpg/leg) + la/2 + lpa) \times \tan\theta_{PD}}{1 - \tan\theta_{PD} \times \tan\theta_a} \right\} \times \{\tan\theta_a + \tan(2\theta_{PD} + \theta_a)\} \quad \text{Equation 1}$$

wherein a reference point is set as a contact point on the window and a vertical line extends from a light emitting point of the semiconductor element perpendicular to the window; and wherein lga indicates a distance between the photodetector and the reference point on the window where light reflected from the photodetector strikes, and lg indicates a distance between the reference point and an outermost circumference of the window, wherein the relationship between lga and lg is such that lga>lg; and wherein $\theta_a = \tan^{-1}(la/2leg)$, and the value of $\theta_{PD}$ satisfies the equation and $\theta_{PD}$ represents an angle of inclination of the photodetector, lpg represents a distance between the window and the photodetector, leg represents a distance between the emission end face and the window, la represents a distance between the emission point and the outermost surface of the semiconductor laser element, and lpa represents a distance between the emission point and a supporting point of inclined photodetector.

In addition, the semiconductor laser device according to the present invention, the reflectance of the window is set to be greater than or equal to 4% and less than or equal to 60%.

In addition, in the semiconductor laser device according to the present invention, the window has unsymmetrical reflectances between the light receiving side and the light transmitting side.

In addition, the semiconductor laser device according to the present invention, the AR coating can be only applied to one side of the window.

In addition, according to another mode of the present invention, the semiconductor laser device comprises: a semiconductor laser element; a window allowing light rays emitted from a light emitting end face of the semiconductor laser element to transmit there through; a photodetector for detecting a portion of light reflected from the window; a stem having the semiconductor laser element and the photodetector disposed thereon; wherein the window is disposed vertically above the semiconductor laser element, and the photodetector is disposed at an angle to a horizontal plane of the device along a main surface of the stem.

Further, in the semiconductor laser device according to the present invention, the reflectance of end face opposed to the light emitting face is set to be greater than or equal to 95%.

Additionally, in the semiconductor laser device according to the present invention, the stem has a projection on the main surface, and the semiconductor laser element is placed on the side face of the projection.

Still further, in the semiconductor laser device according to the present invention, the window is bonded to a cylindrical cap having an opening in the center of its top portion and is bonded to the stem; and the surface of the emission side of the window is contiguous with approximately the whole area of the closed top portion of the cap.

In the semiconductor laser device according to the present invention, the window and the cap can be bonded by a material which absorbs light emitted from the laser element.

Further, in the semiconductor laser device according to the present invention, the angle of inclination of the photodetector to a horizontal plane is consistent with the angle of the light reflecting from the photodetector striking the window contiguous to the closed top portion of the cap, wherein the reflected light is a portion of reflected light from the window which strikes the photodetector.

The semiconductor laser device according to the present invention can achieve notable effects by having each of the characteristics described above, and the APC drive can be activated by light radiated from the emission end face side of the semiconductor laser element. Thus, a semiconductor laser device that is capable of a stable APC drive regardless of the deterioration of the semiconductor element can be provided.

DETAILED DESCRIPTION OF THE PREFERRED EMBODIMENTS

Figure 1:
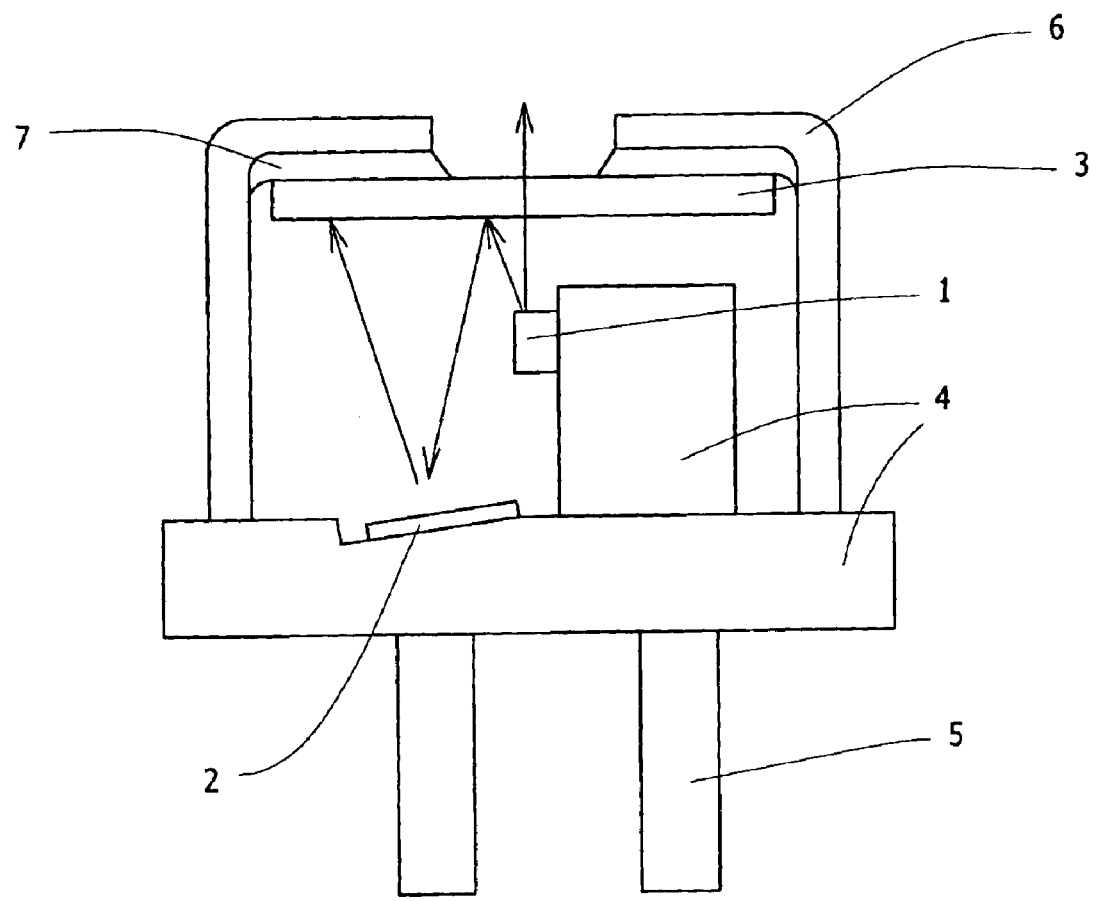
FIG. 1 is a schematic cross-sectional view showing the construction of the semiconductor laser device of the present invention.

Next, preferred embodiments of the present invention will be described. The present invention relates to a semiconductor laser device comprising a window allowing light emitted from the semiconductor laser element to transmit there through, and a photodetector for detecting a part of the emitted light reflected from the window that was not transmitted, wherein the photodetector is disposed so as to be inclined from a horizontal plane. Here, the window which allows light to transmit there through means a window having a function that releases at least a laser light emitted from a semiconductor laser element.

In addition, the semiconductor laser device according to the present invention comprises a semiconductor laser element, a window allowing light emitted from the light emitting end face to transmit there through, a photodetector for detecting a part of the emitted light reflected from the window that is not transmitted there through, and a stem whereon the semiconductor laser element and the photodetector are installed. The window is disposed vertically above the semiconductor laser element, and the photodetector is disposed at an angle with respect to a horizontal plane and contiguously to the main surface of the stem.

According to above configuration, the APC (automatic power control) drive can be activated by a portion of the radiated light that comes from the emitting face of the semiconductor element and is reflected by the window. In this way the APC drive becomes independent of the amount of degradation of the semiconductor laser element. In addition, the re-entering of the reflected light from the photodetector back to the window can be prevented by providing the photodetector at an angle. Consequently, deformation of the laser beam by crossing the reflected light with the main beam can be eliminated.

In addition, light emitting from the monitor-side face of the laser element, i.e., the emission from the end face opposite to the emission face, can be eliminated or almost completely eliminated to the degree of the detection limit, by making the reflectance of the end face opposite to the emission end face of the laser element greater than or equal to 95%. That is, a laser element of high efficiency and high power can be obtained by providing a mirror on the end face of the monitor side so as to eliminate the emission from the monitor side of the design. The more preferable reflectance range is 95% to 100%.

In addition, since the photodetector is directly mounted onto the stem, the device can be simplified, a commercially available stem can be used and excellent versatility can be achieved.

In the semiconductor laser device of the present invention, present invention is designed so that the photodetector is angled with respect to the horizontal plane of the device according to the following equation:

$$lg < lga = \left\{ lpg + \frac{((la/2) \times (lpg/leg) + la/2 + lpa) \times \tan\theta_{PD}}{1 - \tan\theta_{PD} \times \tan\theta_a} \right\} \times$$
$$\{\tan\theta_a + \tan(2\theta_{PD} + \theta_a)\}$$

Equation 1 wherein a reference point is set as a contact point on the window and a vertical line extends from a light emitting point of the semiconductor element perpendicular to the window; and wherein lga indicates a distance between the photodetector and the reference point on the window where light reflected from the photodetector strikes, and lg indicates a distance between the reference point and an outermost circumference of the window, wherein the relationship between lga and lg is such that lga>lg; and wherein $\theta_a = \tan^{-1}(la/2leg)$, and the value of $\theta_{PD}$ satisfies the equation.

Figure 2:
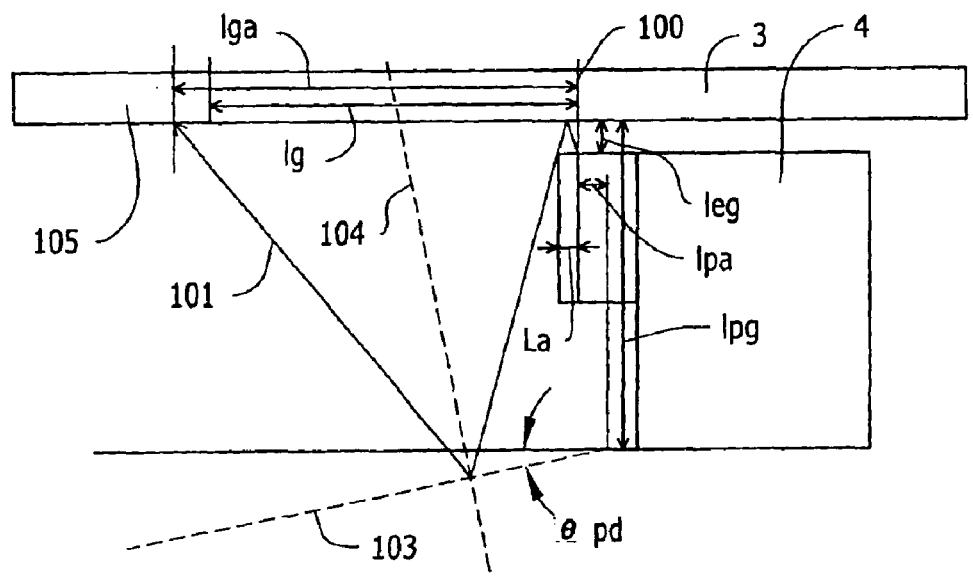
FIG. 2 is a schematic view of the present invention for the purpose of explaining Equation 1.

Here, as shown in FIG. 2, $\theta_{PD}$ represents an angle of inclination of said photodetector 2, lpg represents a distance between said window 3 and said photodetector 2, leg represents a distance between the emission end and the window 3, la represents a distance between the emission point and the outermost surface of said semiconductor laser element, and lpa represents a distance between the emission point and a supporting point of inclined photodetector 2.

Figure 8:
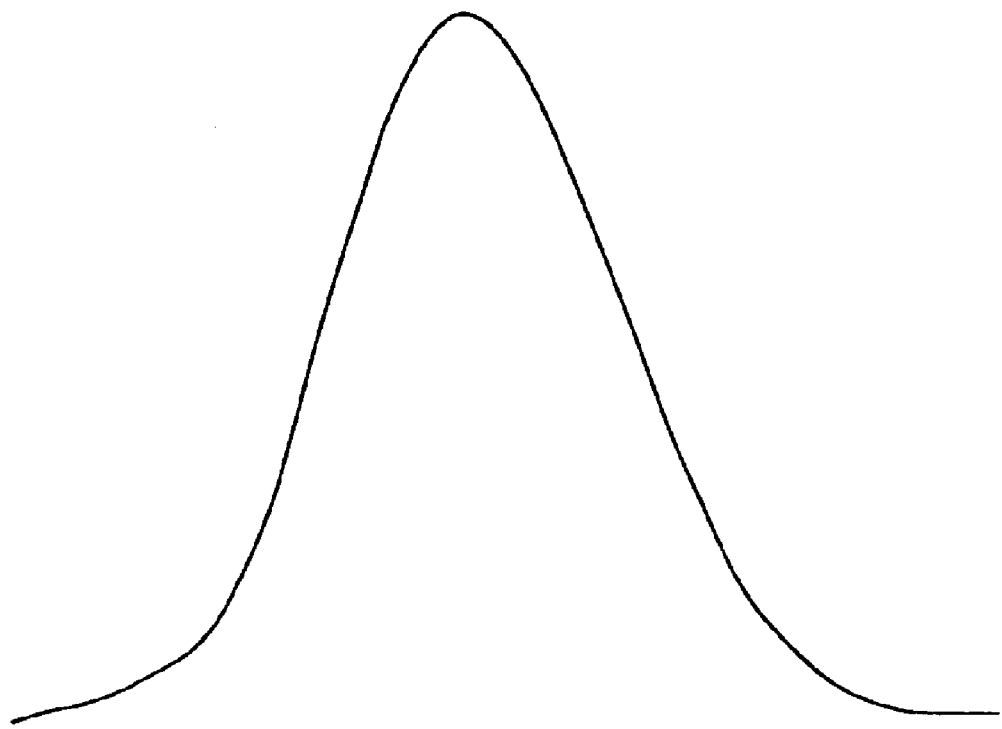
FIG. 8 shows the FFP-Y curve of an embodiment of the present invention.

According to the configuration described above, the angle can be set so that the reflected light from the photodetector 2 will not be released from the window. Consequently, the FFP curve can be maintained as a Gaussian shape as shown in FIG. 8 without being interfered with by the reflected light. FIG. 8 shows a FFP (far-field pattern) in the y-axis direction, that is, in the perpendicular direction.

In the semiconductor device according to the present invention, the reflectance of the window 3 is set to be greater than or equal to 4% and less than or equal to 60%. Even in the case where the semiconductor laser element 1 is of a high power type, the slope efficiency can be maintained without showing significant decline by arranging the reflectance to about 4% to 10%. As for a high power type equal or greater than 30 mW, a stable APC drive is urgently desired in a semiconductor laser device whereon a gallium nitride semiconductor laser element is mounted. In the case where the reflectivity of the window is lower than 4%, a stable APC driving becomes difficult to achieve due to insufficient reflection from the window. Accordingly, the reflectance of the window is preferably 4 to 10%. In addition, when the reflectance of the window is 10% to 60%, the slope efficiency will be decreased, however, excellent controllability can be achieved for a low output type (equal or lower than 30 mW) because the output can be secured. When the reflectance of the window is higher than 60%, the amount of reflection to the photodetector 2 will be increased, however, the light extraction efficiency will become inefficient due to an excessive decrease in the main beam output. Consequently, it is most preferable to provide the reflectance of the window in the range of 4% to 10%. The reflection of the window means the whole reflection of the window wherein the reflectances of the light receiving face and the light transmitting face are combined.

A ball lens or an aspherical lens can be used for the window 3 in the present invention, so as to collect light with ease. In addition, bonding efficiency with the optical fibers can be enhanced. Also, the cost can be decreased by making the window with a ball lens.

In the present invention, the window has reflectances that are not symmetrical for emission at the light receiving side and at the light transmitting side. The difference in reflectivity at the light receiving side and at the light transmitting side eliminates the occurrence of repetitive reflections of incident light inside the window so that occurrence of interference fringes in the FFP due to the interference in the window can be avoided. According to such a construction, the light emitted from the laser element can be efficiently transmitted through the window, and efficiently reflected and introduced to the photodetector.

Figure 3:
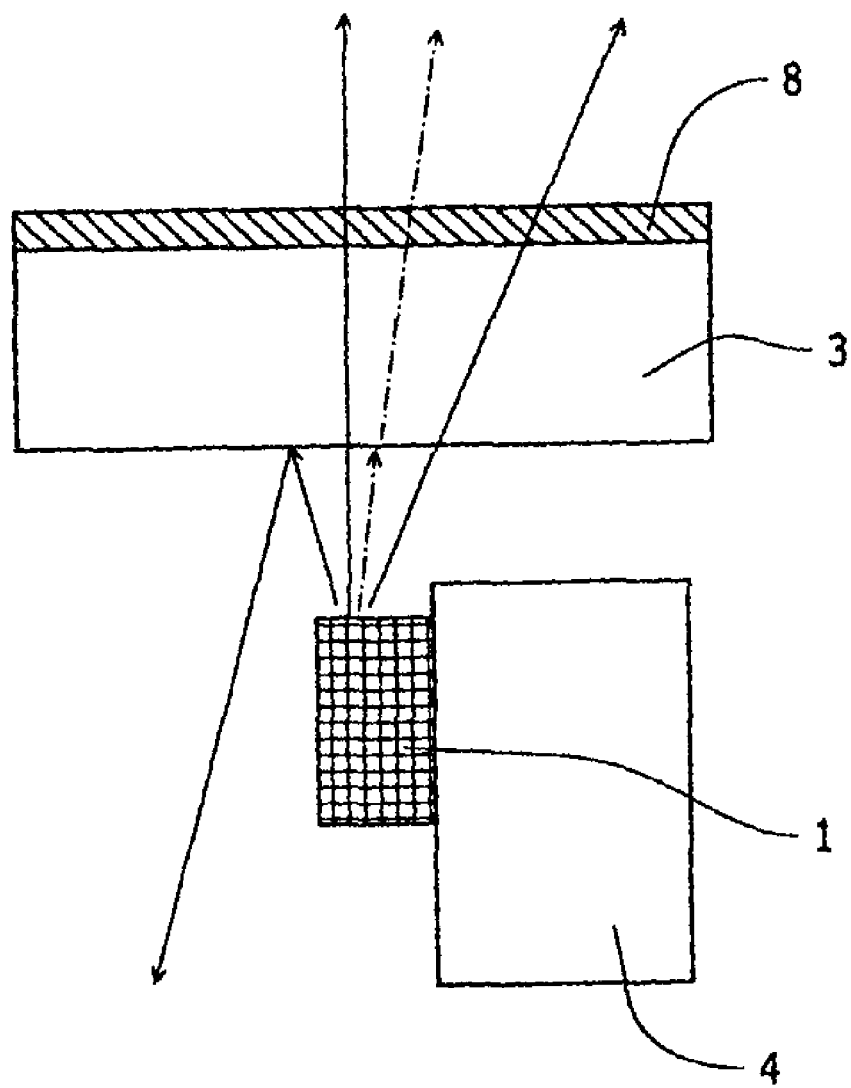
FIG. 3 is a schematic view showing a portion of the construction of an embodiment of the present invention.
Figure 14:
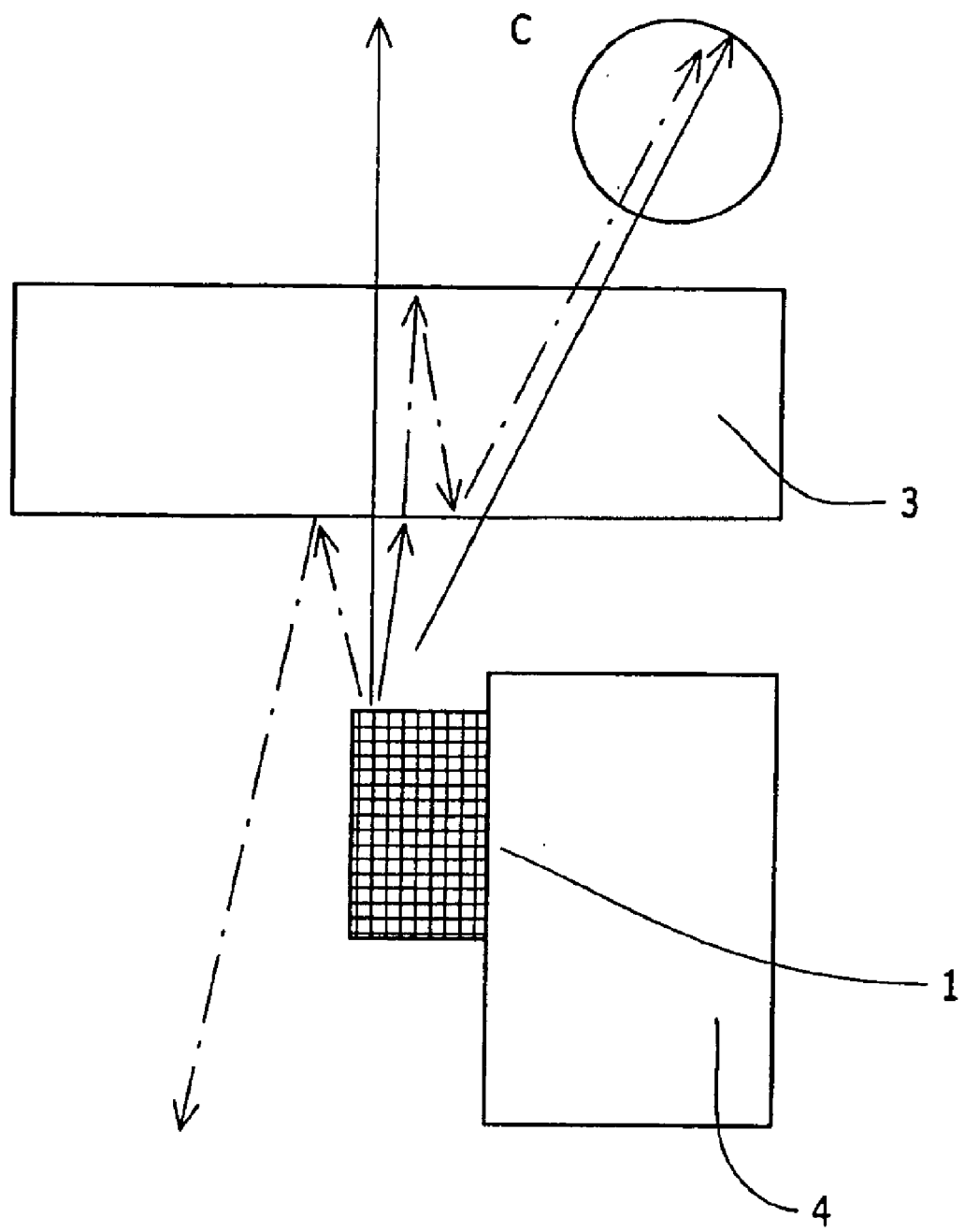
FIG. 14 is a view for explaining a conventional semiconductor laser device.
Figure 15:
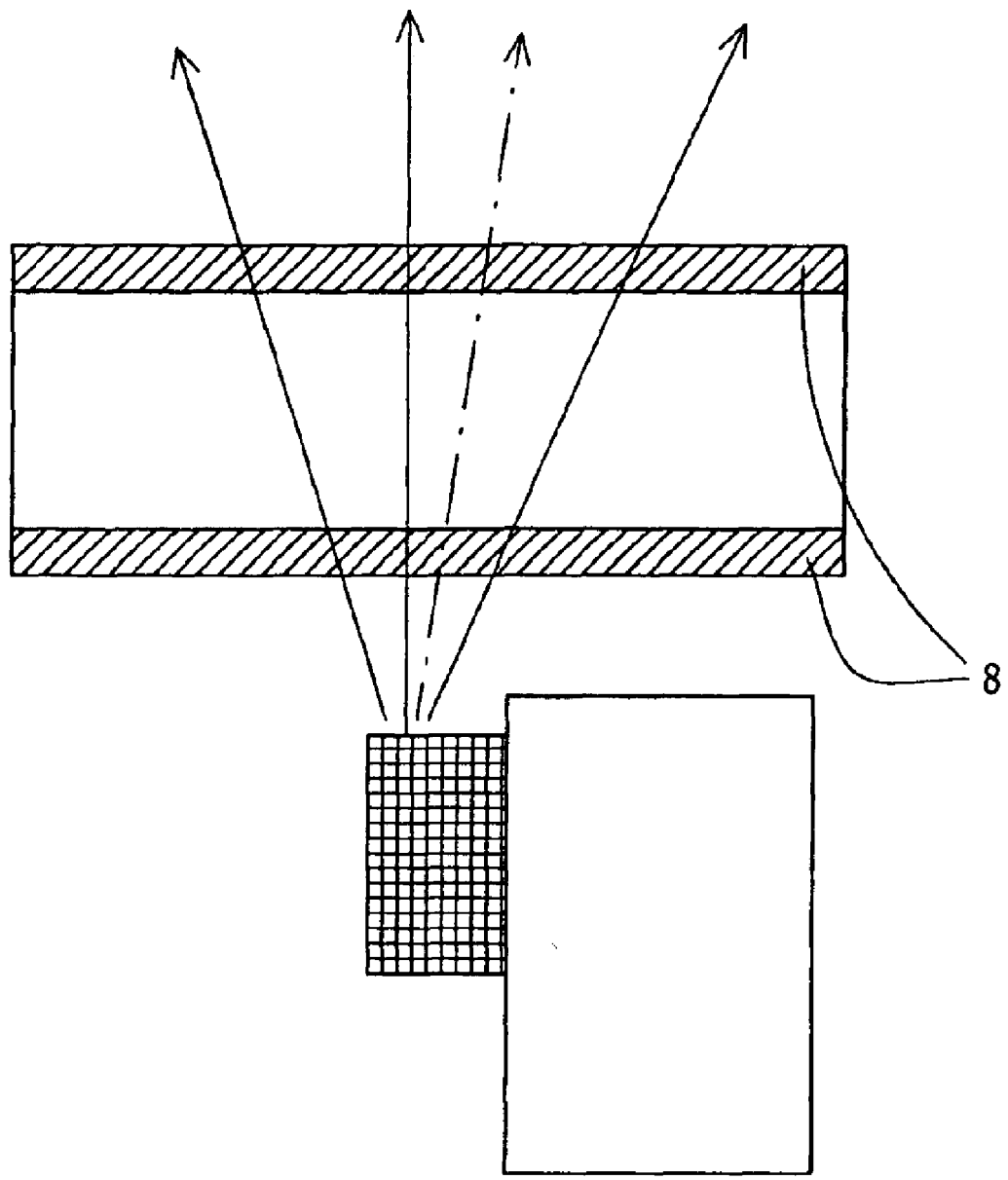
FIG. 15 is a view for explaining another conventional semiconductor laser device.

In the present invention, the AR coating 8 is only applied to either side of the window as described above. Light is not reflected at the surface having the AR coating, i.e. antireflection coating. In the case where the AR coating 8 is not applied to either sides of the window 3, interference fringes will occur in the FFP due to the interference (c) in the window, as shown in FIG. 14. On the other hand, in the case where the AR coating 8 is applied to the both sides of the window, no light will reflected from the window as shown in FIG. 15. Therefore an adequate amount of light will not be supplied to the photodetector. Consequently, in the semiconductor laser device of the present invention, a good FFP can be achieved without suffering interference by having the AR coating on either side of the window, as shown in FIG. 3. The AR coating 8 is not limited to being applied to the light receiving side or the light transmitting side of the window 3. Any kind of surface, such as a surface without having a treatment or having a low reflectivity film compared to an untreated surface can be used, as long as the other side does not have an AR coating. In addition, since only one side has the AR coating, a portion of the light will be reflected from the other side of the window and this favorably strikes the photodetector 2.

In addition, the semiconductor laser element 1 according to the present invention is placed on the side face of the projection on the main surface of the stem 4. According to such a construction, downsizing of the device can be obtained with ease. In addition, the photodetector 2 is directly placed on the stem 4, so that the laser element is placed between the window 3 and the photodetector. This describes the physical relationship between the laser element and the photodetector in the vertical direction. By assembling a semiconductor laser device having an APC drive according to such a construction, the optical path length of a laser light emitted from the semiconductor laser element that strikes the photodetector can be lengthened. This enables the photodetector to be separated from the projection of the stem, so that a good mounting assembly can be achieved. That is, when the light emitted from the monitor side is detected by the photodetector placed on the stem, the emission from the end face of the monitor side will directly enter into the photodetector. Therefore a strong light can not be detected unless the photodetector is placed vertically under the laser element as close as possible. Also, the photodetecting side of the photodetector which is opposite from the laser element can hardly detect light. On the other hand, according to the present invention, light emitted from the emission side of the semiconductor element strikes the photodetector after reflecting from the window, so that a longer optical path length can be obtained. This arrangement enables detection of a strong light at the position even if it is separated from the laser element. In addition, light can be detected at the center of the detector plane of the photodetector, so that an accurate output control on the laser element by the photodetector can be achieved. Although such an effect can be achieved for a semiconductor laser device by placing a photodetector in a horizontal position, the effect can be especially achieved by placing the photodetector at an angle to prevent the light reflected from the photodetector from striking the window again.

Figure 4A:
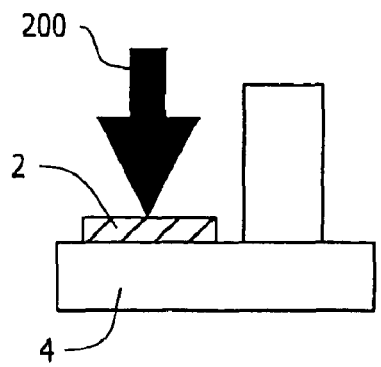
FIGS. 4A–4D show a comparison between different cases according to the present invention; in one case the light is received at the corner of the photodetector, and in another case, the light is received at the center of the photodetector.
Figure 4B:
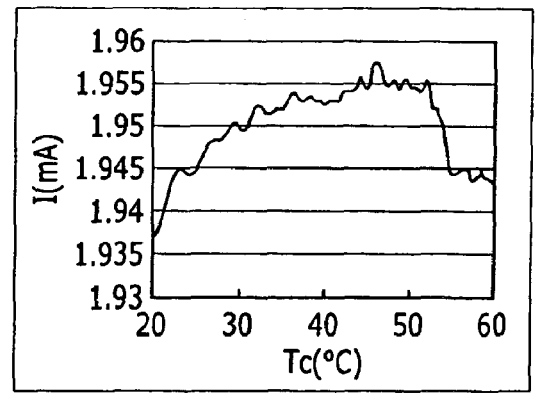
Figure 4C:
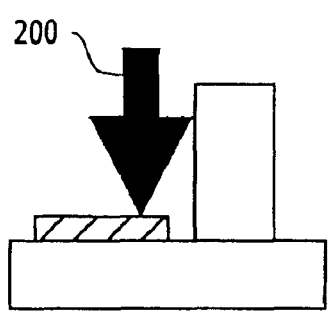
Figure 4D:
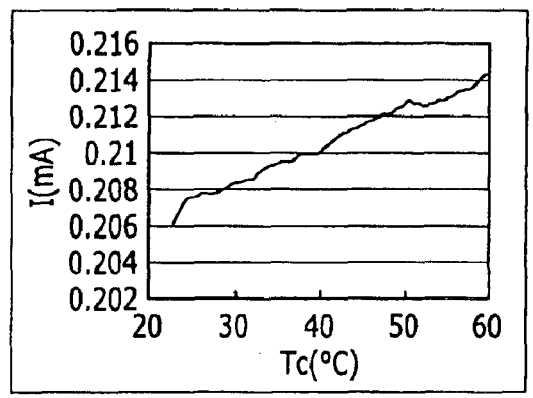

In addition, the effect of the present invention will be also described with the following measurement results. As shown in FIGS. 4A–4D, the cases where the laser light 200 is received at the corner, and at the center of the photodetecting face of the photodetector 2 are compared. When the laser light 200 is received at the center of the photodetector as shown in FIG. 4A, the electric current changed as shown in FIG. 4B. When the laser light 200 is received at the center of the photodetector in FIG. 4C, the electric current changed as shown in FIG. 4D. FIGS. 4B and 4D show the temperature characteristics of the sensitivity in photo-receiving measured as the change in the electric current versus temperature. The greater value of the electric current indicates a better photo-receiving sensitivity. In the case where the laser light 200 enters as shown in FIG. 4C, the electric current is about 0.208 mA at 30° C., and in the case as shown in FIG. 4A, the electric current is about 1.95 mA at 30° C. A high photo-receiving sensitivity can be achieved by receiving the laser light 200 at the center of the photodetector. The variation of the electric current (shown as a deviation from the value at 30° C.), for example, in the case where the temperature of the photodetector rises from 30° C. to 50° C., the variation of the electric current is 0.2% in FIG. 4A and 2% in FIG. 4C. This result indicates that when the laser light 200 is received at the center of the photodetector, a fluctuation of photo-receiving sensitivity due to a change in temperature can be prevented, and the excellent temperature characteristics for sensitivity in photo-receiving can be achieved. That is, compared with the conventional method wherein light emitted from the monitor side is received by the photodetector placed on the stem 4, the photodetector according to the present invention can function with a high sensitivity and reliability. Further the light from the emission end face of the laser element is reflected from the window and then received at the photodetector.

In addition, in the present invention, the reflectance of the monitor side, i.e. the end face of the semiconductor laser element 1 opposed to the light emitting face is set greater than or equal to 95%, and the AR coating is applied to either side of the window 3, are designed so that the photodetector functions with a high sensitivity and reliability. These goals have been difficult to realize previously by a conventional method having a simple construction. Next, this device will be described.

Figure 5A:
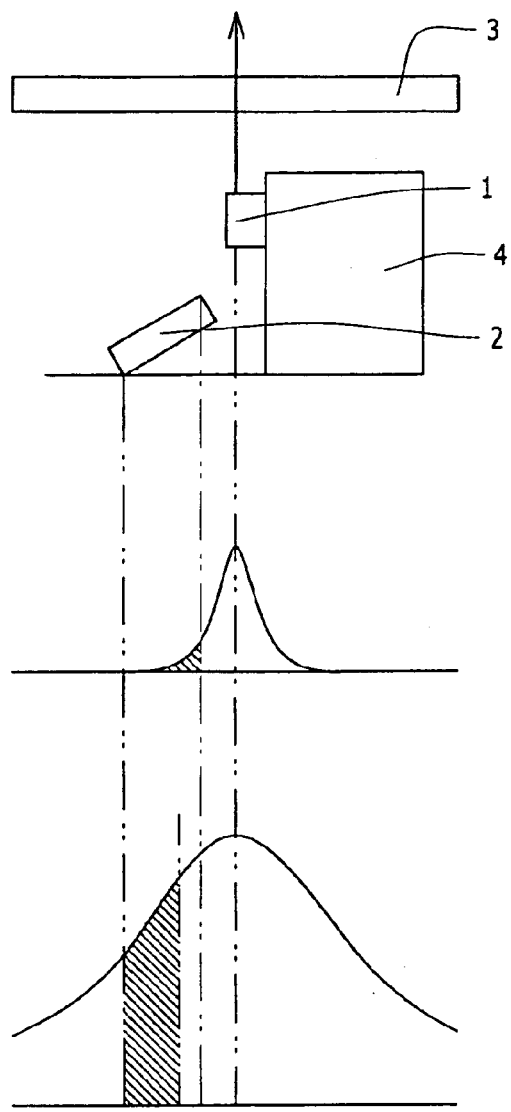
FIGS. 5A and 5B show a comparison of photo-detecting between a device according to the present invention and a conventional device.
Figure 5B:
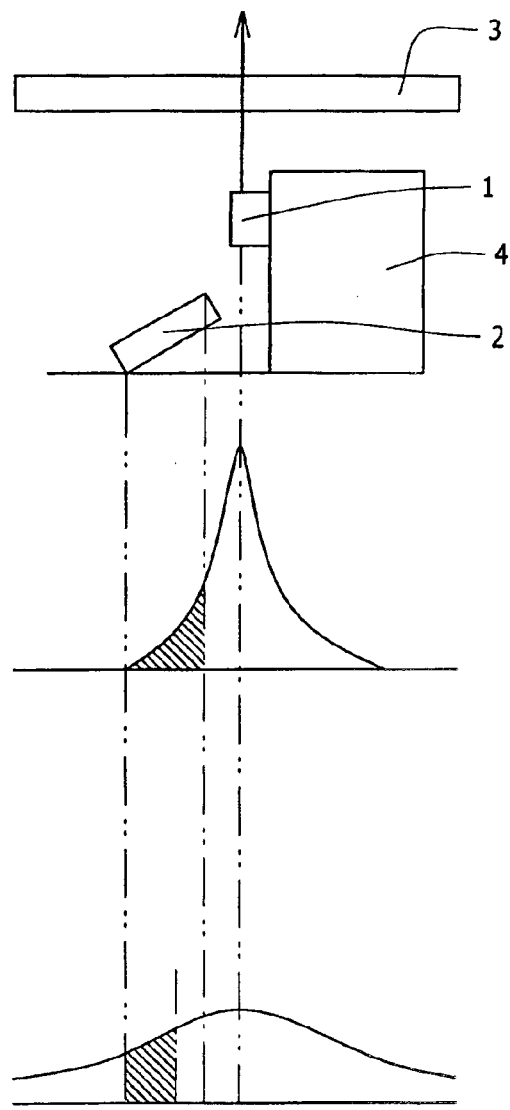

FIGS. 5A and 5B show the sensitivity of photodetectors in structures which use the light emitted from the monitor side for photo-detection at the photodetector. FIG. 5A shows the semiconductor laser element of the present invention and FIG. 5B shows a conventional semiconductor laser element. The first graph below the structure shows the intensity peak of emission from the monitor side of the semiconductor laser element at the surface of the stem where the semiconductor laser element and the photodetector are installed. The vertical axis indicates the intensity of light and the shaded portion indicates the light striking the photodetector.

In addition, the lower graph shows the intensity peak of reflected light from the window at the surface of the stem which is emitted from the emission side of the semiconductor laser element placed as shown in the upper portion of the figures. The vertical axis indicates the intensity of light wherein the shaded portion indicates the light striking the photodetector. According to the present invention, by setting the reflectance of the monitor side to 95% or greater, the light intensity from the monitor side is significantly smaller than the conventional device as shown in the first graph. On the contrary, the light intensity of reflected light is significantly stronger than the conventional device as shown in the lower graph. The conventional structure as shown in the lower graph hardly shows the light intensity. Thus, the functions of a photodetector can not be fully exerted in the conventional device because the light emitted from the monitor side is strong and the end face side of the photodetector is struck with a strong light, as described in connection with FIG. 4.

On the contrary, in the device according to the present invention, the light from the monitor side is very weak or basically nonexistent and therefore few problems can be seen. In addition, very little light reflects from the window in the conventional device. However, in the present invention, the reflected light from the window is strong, and the optical path length of emitted light from the laser element to the photodetector is longer than that from the monitor side to the photodetector. Therefore, the light intensity peak also becomes broad. Consequently, a strong emission can be detected at the center of the photodetector and thus the functions of the photodetector can be sufficiently exerted.

Furthermore, in the case as shown in the lower graph, the emission is interrupted by a portion of reflected light from the window striking the semiconductor laser element. As a result, the end portion of the photodetector can be prevented from being struck with light, which is more preferable for exerting the functions of the photodetector described above. Such effects of the present invention can be realized at least on the surface of the photodetector, by receiving stronger light at the center than the end portion of the surface, and receiving stronger reflected light from the window than the light emitted from the end face of the monitor side.

In addition, the construction of the emission striking the photodetector wherein the reflected light from the window is stronger than the light emitted from the end face of the monitor side is also realized. For example, this can be achieved by forming an optical shielding portion between the end face of the monitor side and the photodetector. By combining this effect with the present invention, further improvement in exerting the function of the photodetector can be achieved. As for the optical shield, for example, the stem 4 wherein the project portion further having a surface opposed to the end face of the monitor side can be used. It is also possible to use a component having an additional function such as a Zener diode or the like which is placed on the projection of the stem between the end face of the monitor side and the photodetector. Furthermore, a light absorption film (such as silicon, amorphous silicon, SiO, SiC, TiO and the like) can be formed on the opposite face to the photodetector. The monitor side in the present invention is a side of the semiconductor element that is opposite to the main surface of the stem where the photodetector is placed.

In addition, the window 3 according to the present invention is bonded to a cylindrical cap 6 having an opening in the center of its top portion and the cap 6 is also bonded to the stem. The surface of the emission side of the window is contiguous with approximately the whole area of closed top portion of the cap. According to such a construction, an opening sufficient for emitting light only from the semiconductor element can be formed so that the reflected light from the photodetector can be prevented from emitting out from the window.

In addition, the window and the cap according to the present invention can be bonded by a material 7 which absorbs light emitted from the laser element. Thus, by using a material which absorbs emission from the laser element for bonding the window and the cap, repetitive reflection of the light inside of the cap can be prevented. If light which is repeatedly reflecting inside the cap is emitted out from the window, it may affect the FFP curve.

The semiconductor laser device according to the above construction can maintain a constant output of a semiconductor laser element that is continuously oscillating for long time. This is true even for a high-power type semiconductor laser element of equal or greater than 30 mW and even for 50 mW, while maintaining uniform light power to the photodetector throughout the long-term continuous oscillation.

A semiconductor laser device according to the present invention as shown in FIG. 1 comprises a semiconductor laser element 1 placed on a stem 4, where the lead terminals 5 are attached, and the stem 4 has the effect of a heat sink, a window 3 which allows the light emitted from the semiconductor laser element 1 to transmit there through, and a photodetector 2 which receives light reflected from the window 3. A gallium nitride semiconductor laser element is used at the peak wavelength of 408 nm in the present embodiment. Little laser light is emitted from the monitor side of the semiconductor laser element; which can be realized by arranging the reflectance of the mirror on the end face of the monitor side of the semiconductor element equal to or greater than 95%. For example, a dielectric multilayer film consisting of a layer of $ZrO_2$ and six pairs of $(SiO_2/ZrO_2)$ formed thereon can be cited. In addition, the photodetector is placed at an angle with respect to the horizontal plane.

In addition, as for the semiconductor laser element 1 of the present invention, the active layer having a multiple quantum well structure or a single quantum well structure is formed between the n-type semiconductor layer and the p-type semiconductor layer. A blue semiconductor laser element is formed with a Group III nitride semiconductor.

An example of a semiconductor laser element comprises a Group III nitride semiconductor having a foundation layer of undoped $Al_xGa_{1-x}N$ ($0 \leqq x \leqq 1$) is formed on a substrate made of sapphire, SiC, GaN and the like, whereon a n-type contact layer of Si-doped $Al_xGa_{1-x}N$ (0<x<1), a crack preventing layer of Si-doped $In_xGa_{1-x}N$ ($0 \leqq x \leqq 1$), a cladding layer having a superlattice structure comprising undoped $Al_xGa_{1-x}N$ ($0 \leqq x \leqq 1$) and Si-doped GaN, a n-type guide layer of GaN, an active layer having a multiple quantum well structure comprising a well layer of undoped $In_xGa_{1-x}N$ (0<x<1) and a barrier layer of Si-doped or undoped $In_xGa_{1-x}N$ (0<x<1), a cap layer of Mg-doped $Al_xGa_{1-x}N$ (0<x<1), a p-type guide layer of undoped GaN, a p-type cladding layer having a superlattice structure comprising of undoped $Al_xGa_{1-x}N$ ($0 \leqq x \leqq 1$) and Mg-doped GaN, and a p-type contact layer of Mg doped GaN, are respectively layered.

Furthermore, a light reflective film comprising more than five pairs of $SiO_2$ and $ZrO_2$ is provided on the reflective surface of the waveguide end face in the semiconductor laser element, so as to have reflectivity equal to or greater than 95%, and preferably equal to or greater than 99%. In addition, an end face protective film may be formed on the emission face. It is only necessary for the emission face side to have a reflectivity sufficient to release laser light in preferably the range of 1% to 20%.

In addition, a material used for die bonding the photodetector 2 which is used for detecting light, and the semiconductor laser element 1 which is mounted on the stem includes a solder, Au—Sn, Ag paste, Indium-alloy, or the like. This material should have a good bonding strength and preferably has efficient heat release characteristics.

EXAMPLES

Examples of the present invention will be described below.

Example 1

The present example shows a process of manufacturing a semiconductor laser device according to the present invention. A photodetector 2 is attached to the stem by way of die bonding using Au—Sn as a bonding material. Then a semiconductor laser element 1 is attached to the stem by way of die bonding using a similar bonding material. After the photodetector 2 and the semiconductor laser element 1 are supplied with wire bonding and the cap 6 having the window 3 is welded to form a semiconductor laser device.

Here, the AR coating 8 is applied to either side of the window 3, i.e., the incident side or the emission side, and the window is bonded to the cap with a low-melting glass including lead and oxygen as main components. A conventional material can be used for the window 3 or the cap 6. A low-melting glass is black in color when bonded and absorbs light of 408 nm.

In the semiconductor laser device of the present example, a photodetector 2 is placed in a position that can be analyzed by the following Equation 1. The present example is described below with reference to FIG. 2.

That is, in the semiconductor laser element described above, a reference point 100 is set as the contact point of the window and a vertical line extended from the light emitting point of the semiconductor element in the direction of emission that is perpendicular to the window. The value lga in the following equation indicates the distance between the photodetector and the point on the window where the reflected light from the photodetector strikes. The value lg in the following equation indicates the distance between the reference point and outermost circumference of the window, wherein the relation between lga and lg is such that lga>lg.

$$lg < lga = \left\{lpg + \frac{((la/2) \times (lpg/leg) + la/2 + lpa) \times \tan\theta_{PD}}{1 - \tan\theta_{PD} \times \tan\theta_a}\right\} \times \quad \text{Equation 1}$$

$$\{\tan\theta_a + \tan(2\theta_{PD} + \theta_a)\}$$

where $\theta_a = \tan^{-1}(la/2leg)$, and the value of $\theta_{PD}$ satisfies the equation.

Here, as shown in FIG. 2, $\theta_{PD}$ represents an angle of inclination of the photodetector, lpg represents the distance between the window and the photodetector, leg represents the distance between the emission end face and the window, la represents the distance between the emission point and the outermost surface of the semiconductor laser element, and lpa represents the distance between the emission point and a supporting point of the inclined photodetector 2.

In addition, in FIG. 2, 104 indicates a line perpendicular to the reflective surface of the photodetector, and 103 indicates the reflective surface of the photodetector. Here, the above lpg is 1000 to 1500 µm, leg is 50 to 1000 µm, la is 0.2 to 1.2 µm, lpa is 0 to 300 µm, and lg is 400 to 1600 µm.

A semiconductor laser device is fabricated in accordance with the conditions on the ranges of lpg, leg, etc. as described above, and the inclination of the photodetector $\theta_{PD}$ which satisfies lga>lg when the photodetector is inclined from 0° to 30° is examined. When $\theta_{PD}$ is greater than 30°, the incident area will be narrowed, and the light extraction efficiency will decrease. The value lg is set as 500 µm in Equation 1. When $\theta_{PD}$ is 0°, lga will be 4.11; that is, the above range will not be fulfilled. In the case where $\theta_{PD}$ is set as 10°, lga will be 503 µm, and the reflected light 101 will strike the portion from where the light will not be emitted outward, as shown in FIG. 2 by reference numeral 105, and the above range will be fulfilled. According to the condition described above, a semiconductor laser device capable of a stable APC driving regardless of the deterioration of the semiconductor element can be obtained; and also the photodetector can function with a high sensitivity and high reliability.

The AR coating 8 is an anti-reflection coating. It is preferable that the AR coating only be applied to one side of the window. As for the method of adding the AR coating, a dielectric film is formed on a glass by using a vacuum evaporator or sputtering and the like.

Figure 6:
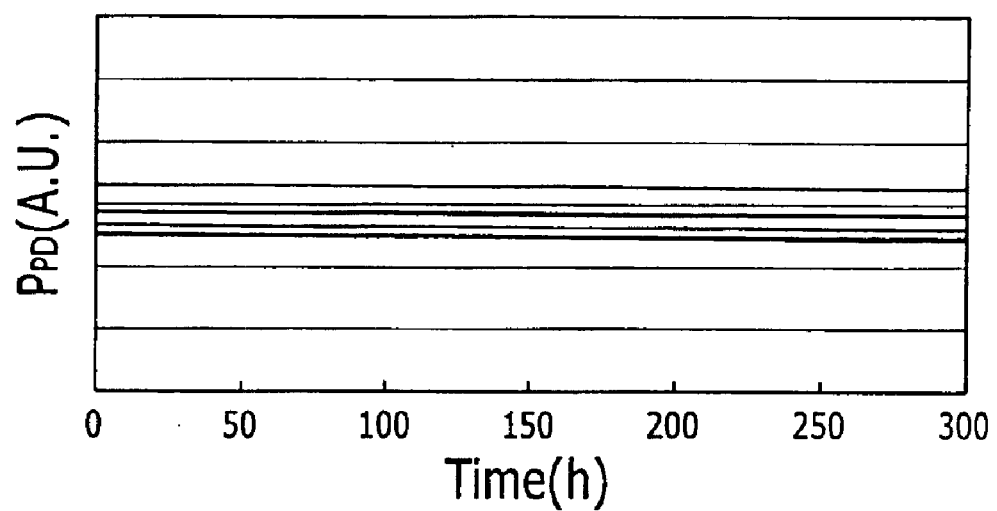
FIG. 6 is a graph showing the monitor power with front APC driving according to the present invention.

The semiconductor laser device thus obtained is capable of maintaining stable power at the photodetector during continuous oscillation for long time, as shown for example in FIG. 6. In the case of a conventional semiconductor laser device which detects light from the monitor side as a comparative example, the power at the photodetector fluctuates, as shown for example in FIG. 7, due to deterioration of the semiconductor laser element. Furthermore, the FFP in the direction of the Y axis according to the device of the present invention shows a Gaussian shape as shown in FIG. 8.

Example 2

A semiconductor laser device is made in the same manner as in Example 1 except for setting the distance from the reference point 100 to the outermost perimeter of the window to 800 µm, i.e. lg=800. The value of $\theta_{PD}$ which satisfies lga>lg is in the range of 16° to 30°. For example, the value of $\theta_{PD}$ can be set as 23°. Similar effects as those mentioned in Example 1 can be achieved.

Example 3

Figure 10:
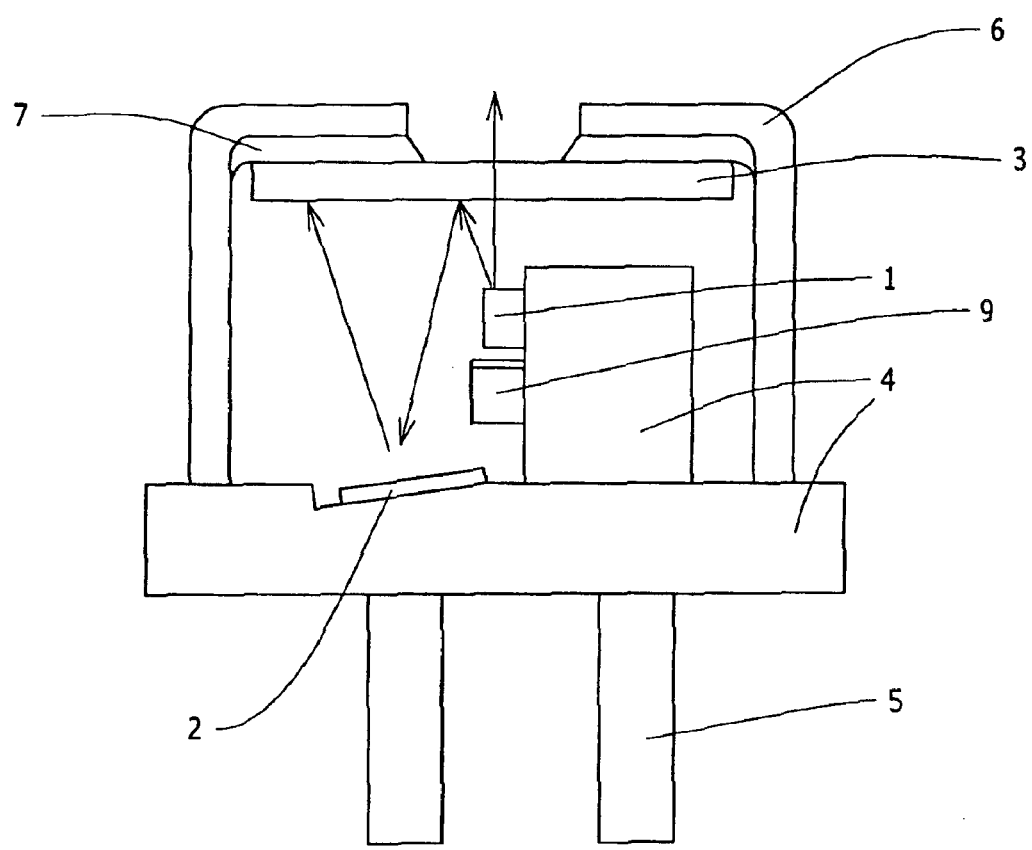
FIG. 10 is a schematic cross-sectional view showing the construction of another embodiment of the present invention.
Figure 11:
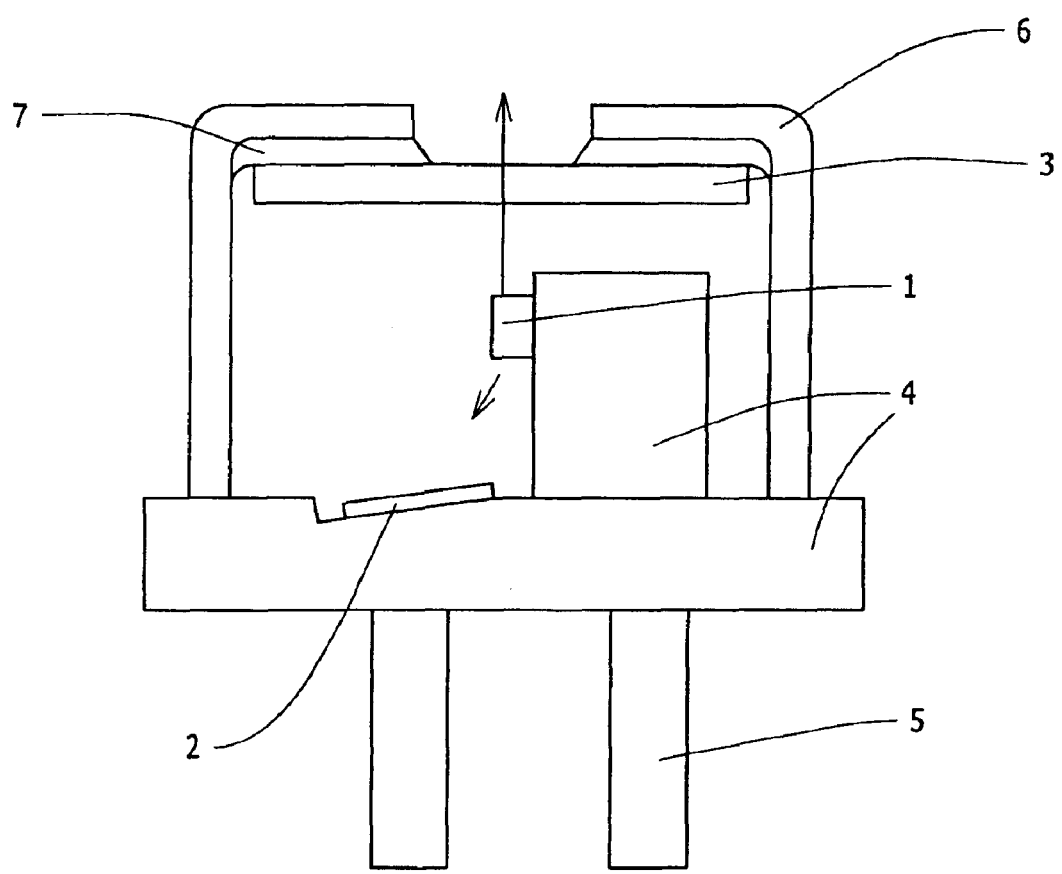
FIG. 11 is a schematic cross-sectional view showing the construction of a conventional semiconductor laser device that helps explain the Comparative Example.
Figure 12:
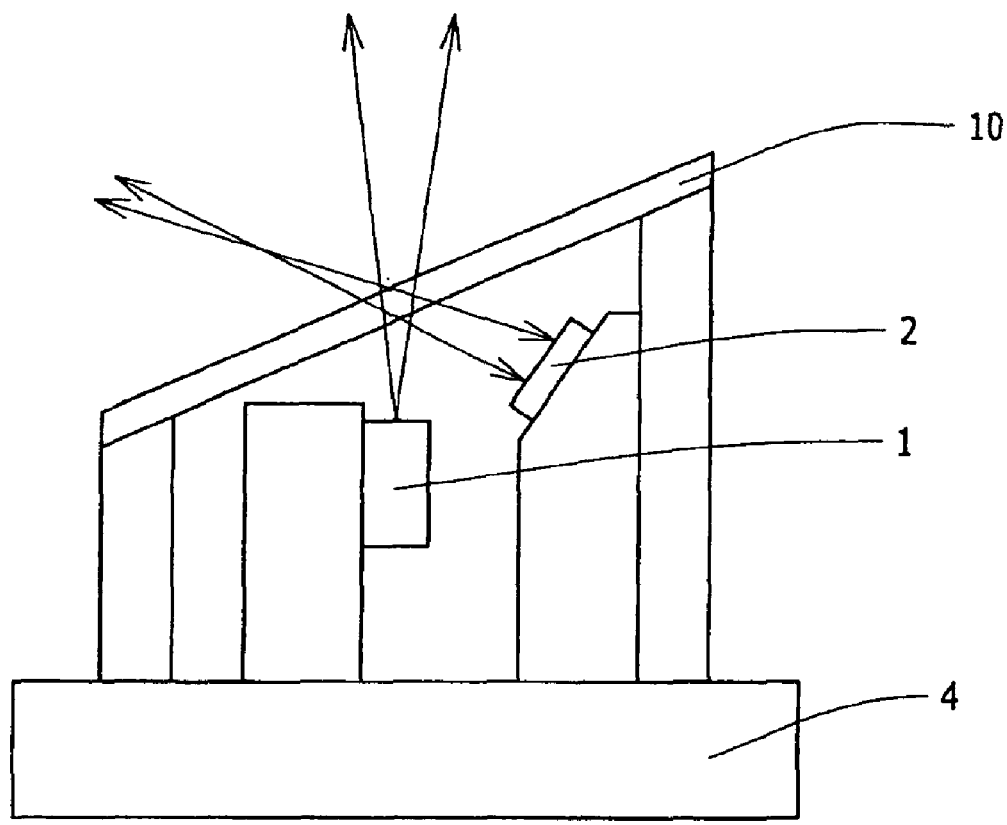
FIG. 12 is a schematic cross-sectional view showing the construction of a conventional semiconductor laser device.

In Example 3, a semiconductor laser device is made in the same manner as in Example 1, except for a Zener diode 9 that is placed on the projection of the stem. As shown in FIG. 10, the end face of the Zener diode 9 is placed opposite to the monitor side end face of the semiconductor laser element. A SiO layer as an optical absorption film is further formed on the end face of the Zener diode. According to this construction, little light from the end face of the monitor side end face enters the photodetector, thereby the reliability of the photodetector can be further improved.

Comparative Example 1

Figure 7:
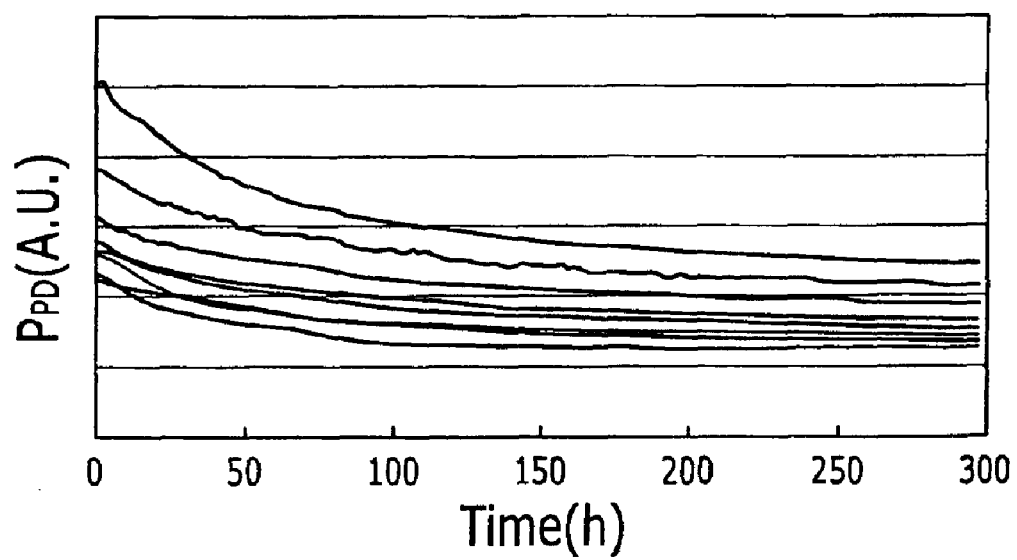
FIG. 7 is a graph showing the monitor power with conventional front APC driving according to the Comparative Example.
Figure 13:
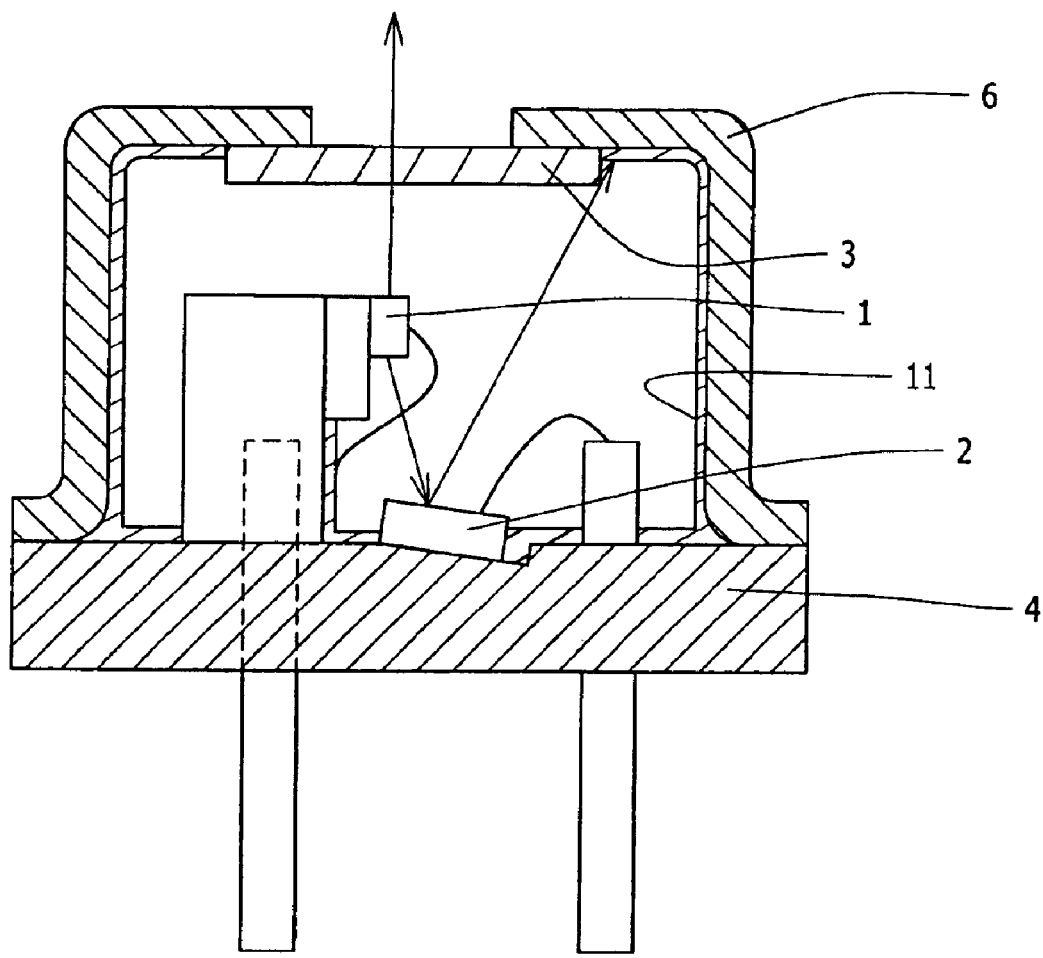
FIG. 13 is a schematic cross-sectional view showing the construction of another conventional semiconductor laser device.

In Comparative Example 1, a semiconductor laser device having a conventional structure wherein the laser light is detected at the monitor side of the photodetector of a semiconductor laser element is shown in FIG. 13. In such a semiconductor laser device, the power which is detected at the photodetector during continuous oscillation for a long time, fluctuates as shown in FIG. 7. The detected power shown in FIG. 6 and FIG. 7 are measured using the same output conditions.

Comparative Example 2

Figure 16:
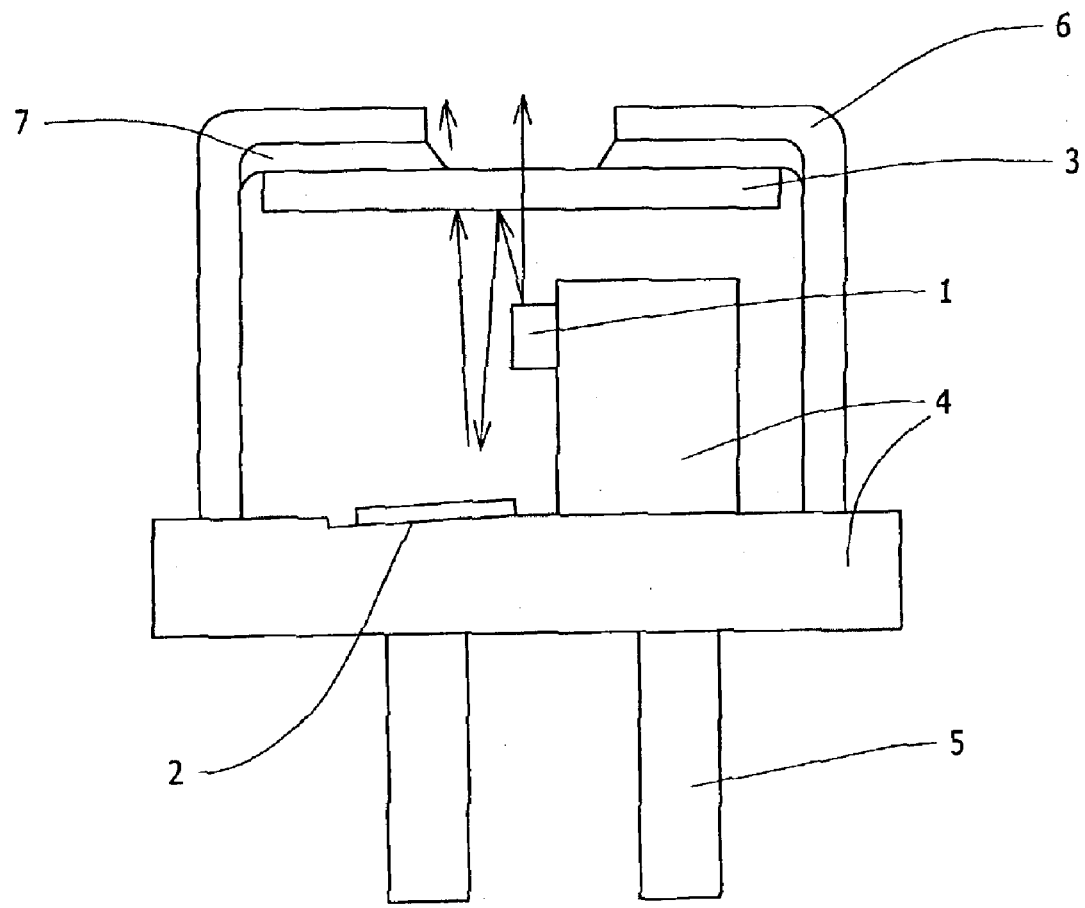
FIG. 16 is a schematic cross-sectional view explaining another conventional semiconductor laser device.

A semiconductor laser device wherein the inclination of the photodetector is out of range of Equation 1, as in FIG. 16, is shown in Comparative Example 2.

Figure 9:
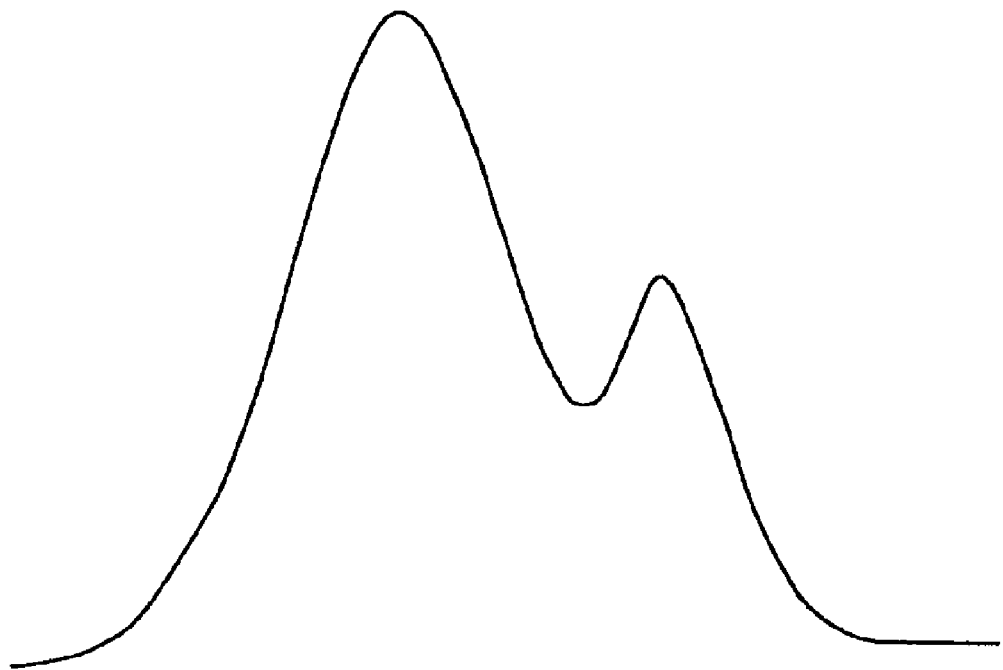
FIG. 9 shows the FFP-Y curve of a conventional mode according to the Comparative Example.

In such a semiconductor laser device, reflected light from the photodetector can be released from the window and mixed into the main beam. Thereby the FFP in the direction of the Y axis becomes non-Gaussian as shown in FIG. 9.

As described above, a semiconductor laser device of the present invention can maintain a stable APC regardless of the deterioration of the semiconductor laser element, by having a photodetector for detecting emission from the semiconductor laser element via reflected light from the window. Furthermore, the inclination of the photodetector is in the range that satisfies Equation 1, and also an AR coating is applied to either side of the window. In other words, the reflected light from the photodetector which detects reflected light from the window is prevented from emitting out of the window, whereby interference and noise to the main beam can be avoided.

In addition, a high power laser element can be obtained by setting the reflectivity at the end face opposite to the emission face of the semiconductor laser element equal to or greater than 95%. Furthermore, the photodetector can be operated with a high sensitivity and high reliability by applying an AR coating to either side of the window.

As described above, the semiconductor laser device according to the present invention operates an APC drive only by the light emitted from the emission end face of a semiconductor laser element. Therefore it is capable of operating the APC drive stably, regardless of deterioration of the semiconductor laser element.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

The text of Japanese priority application nos. 2002-169242 filed Jun. 10, 2002 and 2003-135097 filed on May 13, 2002 are hereby incorporated by reference.

What is claimed is:

1. A semiconductor laser device comprising:
    a semiconductor laser element;
    a window allowing light rays emitted from said semiconductor laser element to transmit there through; and
    a photodetector for detecting a portion of the emitted light that is reflected by said window, wherein said photodetector is placed at an angle with respect to a horizontal plane of the device; and
    wherein said photodetector is angled with respect to the horizontal plane of the device according to the following equation:

$$lg < lga = \left\{lpg + \frac{((la/2) \times (lpg/leg) + la/2 + lpa) \times \tan\theta_{PD}}{1 - \tan\theta_{PD} \times \tan\theta_a}\right\} \times \{\tan\theta_a + \tan(2\theta_{PD} + \theta_a)\} \quad \text{Equation 1}$$

wherein a reference point is set as a contact point on said window and a vertical line extends from a light emitting point of said semiconductor element perpendicular to said window; and
    wherein lga indicates a distance between said photodetector and the reference point on said window where light reflected from said photodetector strikes, and
    lg indicates a distance between the reference point and an outermost circumference of said window, wherein the relationship between lga and lg is such that lga>lg; and
    wherein $\theta_a = \tan^{-1}(la/2leg)$, and the value of $\theta_{PD}$ satisfies the equation and $\theta_{PD}$ represents an angle of inclination of said photodetector, lpg represents a distance between said window and said photodetector, leg represents a distance between the emission end face and said window, la represents a distance between the emission point and the outermost surface of said semiconductor laser element, lpa represents a distance between the emission point and a supporting point of inclined photodetector and wherein $\theta_a \neq 0$ and $\theta_{PD} \neq 0$.

2. The semiconductor laser device according to claim 1, wherein reflectance of said window is set equal to or greater than 4% and equal to or less than 60%.

3. The semiconductor laser device according to claim 1, wherein said window has unsymmetrical reflectances between a light receiving side and a light transmitting side.

4. The semiconductor laser device according to claim 1, wherein an AR coating is applied to one side of said window.

5. A semiconductor laser device comprising:
    a semiconductor laser element;
    a window allowing light rays emitted from a light emitting end face of said semiconductor laser element to transmit there through;
    a photodetector for detecting a portion of light reflected from said window;
    a stem having said semiconductor laser element and said photodetector disposed thereon;
    wherein said window is disposed vertically above said semiconductor laser element, and
    said photodetector is disposed at an angle to a horizontal plane of the device along a main surface of said stem and;
    wherein said photodetector is angled with respect to the horizontal plane of the device according to the following equation:

$$lg < lga = \left\{lpg + \frac{((la/2) \times (lpg/leg) + la/2 + lpa) \times \tan\theta_{PD}}{1 - \tan\theta_{PD} \times \tan\theta_a}\right\} \times \{\tan\theta_a + \tan(2\theta_{PD} + \theta_a)\} \quad \text{Equation 1}$$

wherein a reference point is set as a contact point on said window and a vertical line extends from a light emitting point of said semiconductor element perpendicular to said window; and
    wherein lga indicates a distance between said photodetector and the reference point on said window where light reflected from said photodetector strikes, and
    la indicates a distance between the reference point and an outermost circumference of said window, wherein the relationship between lga and la is such that lga>lg; and
    wherein $\theta_a = \tan^{-1}(la/2leg)$, and the value of $\theta_{PD}$ satisfies the equation and $\theta_{PD}$ represents an angle of inclination of said photodetector, lpg represents a distance between said window and said photodetector, leg represents a distance between the emission end face and said window, la represents a distance between the emission point and the outermost surface of said semiconductor laser element, lpa represents a distance between the emission point and a supporting point of inclined photodetector and wherein $\theta_a \neq 0$ and $\theta_{PD} \neq 0$.

6. The semiconductor device according to claim 5, wherein reflectance of an end face of said semiconductor laser element opposed to said light emitting end face is equal to or greater than 95%.

7. The light emitting device according to claim 5, wherein said stem has a projection on the main surface, and said semiconductor laser element is placed on a side face of said projection.

8. The semiconductor laser device according to claim 5, wherein said window is attached to a cylindrical cap having a top portion including an opening in a center portion and said cap is also attached to said stem; and
    a surface of an emission side of said window is contiguous with approximately the top portion of said cap excluding the opening.

9. The semiconductor laser device according to claim 8, wherein an angle of inclination of said photodetector to a horizontal plane is approximately equal to an angle of light reflected from said photodetector that strikes said window contiguous with the top portion of said cap, wherein the light reflected from said photodetector is a portion of light reflected from said window which strikes said photodetector.

10. The semiconductor laser device according to claim 8, wherein said window and said cap are attached by a material which absorbs light emitted from said semiconductor laser element.

11. The semiconductor laser device according to claim 5, wherein said window has unsymmetrical reflectances between a light receiving side and a light transmitting side.

12. The semiconductor laser device according to claim 5, wherein an AR coating is applied to one of a light receiving side or a light transmitting side of said window.

13. The semiconductor laser device according to claim 5, wherein reflectance of said window is set equal to or greater than 4% and equal to or less than 60%.

* * * * *